(12) United States Patent
Lee et al.

(10) Patent No.: US 12,469,764 B2
(45) Date of Patent: Nov. 11, 2025

(54) SEMICONDUCTOR PACKAGE

(71) Applicant: Samsung Electronics Co., Ltd., Suwon-si (KR)

(72) Inventors: Eungchang Lee, Hanam-si (KR); Bangweon Lee, Yongin-si (KR); Jae Choon Kim, Incheon (KR); Kyung Suk Oh, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 513 days.

(21) Appl. No.: 17/862,459

(22) Filed: Jul. 12, 2022

(65) Prior Publication Data
US 2023/0117865 A1    Apr. 20, 2023

(30) Foreign Application Priority Data

Oct. 19, 2021    (KR) .................. 10-2021-0139018

(51) Int. Cl.
*H01L 23/367*     (2006.01)
*H01L 23/00*      (2006.01)
(Continued)

(52) U.S. Cl.
CPC .... *H01L 23/3677* (2013.01); *H01L 23/49816* (2013.01); *H01L 23/49822* (2013.01); *H01L 23/49838* (2013.01); *H01L 24/16* (2013.01); *H01L 24/32* (2013.01); *H01L 24/48* (2013.01); *H01L 24/73* (2013.01); *H01L 25/0652* (2013.01); *H01L 25/105* (2013.01); (Continued)

(58) Field of Classification Search
CPC ............. H01L 23/5383; H01L 23/5386; H01L 23/552; H01L 25/18; H01L 25/0655; H01L 25/0657; H01L 2225/06589; H01L 2225/06506; H01L 2225/0651; H01L 2225/06537; H01L 2225/06541; H01L 2225/06548; H01L 2924/00014; H01L 2924/45099
USPC ....................................................... 257/713
See application file for complete search history.

(56) References Cited

U.S. PATENT DOCUMENTS 8,299,608 B2    10/2012   Bartley et al.
8,619,428 B2    12/2013   Lee et al.
(Continued)

FOREIGN PATENT DOCUMENTS

JP    2007-243989 A    9/2007
JP    2010-219210 A    9/2010
(Continued)

OTHER PUBLICATIONS

Korean Office Action dated Jul. 2, 2025 issued in Korean Patent Application No. 10-2021-0139018.

*Primary Examiner* — Jasmine J Clark
(74) *Attorney, Agent, or Firm* — Harness, Dickey & Pierce, P.L.C.

(57) ABSTRACT

A semiconductor package including a substrate and at least one semiconductor chip on the substrate may be provided. The substrate may include a body layer having a top surface and a bottom surface, a first thermal conductive plate on the top surface of the body layer, the first thermal conductive plate connected to a ground terminal of the semiconductor chip, and a thermal conductive via penetrating the body layer and being in contact with the first thermal conductive plate.

20 Claims, 15 Drawing Sheets

(51) Int. Cl.
*H01L 23/498* (2006.01)
*H01L 25/065* (2023.01)
*H01L 25/10* (2006.01)

(52) U.S. Cl.
CPC ............... *H01L 2224/16227* (2013.01); *H01L 2224/16238* (2013.01); *H01L 2224/32145* (2013.01); *H01L 2224/32225* (2013.01); *H01L 2224/48147* (2013.01); *H01L 2224/48149* (2013.01); *H01L 2224/48227* (2013.01); *H01L 2224/73204* (2013.01); *H01L 2224/73265* (2013.01); *H01L 2225/1023* (2013.01); *H01L 2225/1041* (2013.01); *H01L 2225/107* (2013.01); *H01L 2225/1094* (2013.01); *H01L 2924/1616* (2013.01); *H01L 2924/16251* (2013.01); *H01L 2924/1632* (2013.01); *H01L 2924/182* (2013.01); *H01L 2924/3025* (2013.01)

(56) References Cited

U.S. PATENT DOCUMENTS

| | | | |
|---|---|---|---|
| 8,970,516 | B2 | 3/2015 | Black et al. |
| 9,107,295 | B2 | 8/2015 | Lassmann et al. |
| 9,147,643 | B2 | 9/2015 | You et al. |
| 9,337,073 | B2 | 5/2016 | Liu et al. |
| 9,362,235 | B2 | 6/2016 | Kim et al. |
| 9,674,940 | B2 | 6/2017 | Lee et al. |
| 10,636,765 | B2 * | 4/2020 | Yang ..................... H01L 23/552 |
| 10,834,821 | B2 | 11/2020 | Kidoguchi |
| 2010/0230789 | A1 | 9/2010 | Yorita et al. |
| 2022/0415775 | A1 * | 12/2022 | Song ..................... H01L 23/485 |

FOREIGN PATENT DOCUMENTS

| | | |
|---|---|---|
| JP | 2013-538010 A | 10/2013 |
| KR | 10-2014-0128536 A | 11/2014 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0139018 filed on Oct. 19, 2021 in the Korean Intellectual Property Office, the disclosure of which is hereby incorporated by reference in its entirety.

BACKGROUND

The present inventive concepts relate to semiconductor packages.

A semiconductor package is provided to implement an integrated circuit chip to qualify for use in electronic products. A semiconductor package is typically configured such that a semiconductor die may be mounted on a printed circuit board (PCB) and bonding wires or bumps may be used to electrically connect the semiconductor die to the printed circuit board. With the development of electronic industry, many studies have been conducted to improve reliability and durability of semiconductor packages.

SUMMARY

Some example embodiments of the present inventive concepts provide semiconductor packages with increased reliability.

The object of the present inventive concepts is not limited to the mentioned above, and other objects which have not been mentioned above will be clearly understood to those skilled in the art from the following description.

According to an example embodiment of the present inventive concepts, a semiconductor package includes a substrate and at least one semiconductor chip on the substrate. The substrate includes a body layer having a top surface and a bottom surface, a first thermal conductive plate on the top surface of the body layer, the first thermal conductive plate connected to a ground terminal of the semiconductor chip, and a thermal conductive via penetrating the body layer and being in contact with the first thermal conductive plate.

According to an example embodiment of the present inventive concepts, a semiconductor package includes a substrate, at least one semiconductor chip on the substrate, a mold layer covering the semiconductor chip, and a shield layer covering the mold layer. The substrate may include a body layer having a top surface and a bottom surface, a first thermal conductive plate on the top surface of the body layer, a plurality of signal vias penetrating at least a portion of the body layer, and a thermal conductive via penetrating the body layer and is in contact with the first thermal conductive plate. The thermal conductive via may have a first width. Each of the signal vias may have a second width. The first width may be greater than the second width. The first width may be in a range of 100 μm to 500 μm.

According to an example embodiment of the present inventive concepts, a semiconductor package includes a substrate and at least one semiconductor chip on the substrate. The substrate may include a body layer having a top surface and a bottom surface, a first thermal conductive plate on the top surface of the body layer, a plurality of signal vias penetrating at least a portion of the body layer, and a thermal conductive via penetrating the body layer and being in contact with the first thermal conductive plate. The thermal conductive via may have a first vertical length. Each of the signal vias may have a second vertical length. The first vertical length may be greater than the second vertical length. The first vertical length may be in a range of 120 μm to 500 μm.

DETAIL PARTED DESCRIPTION

Some example embodiments of the present inventive concepts will now be described in detail with reference to the accompanying drawings to aid in clearly explaining the present inventive concepts. In this description, such terms as "first" and "second" may be used to simply distinguish identical or similar components from each other, and the sequence of such terms may be changed in accordance with the order of mention.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
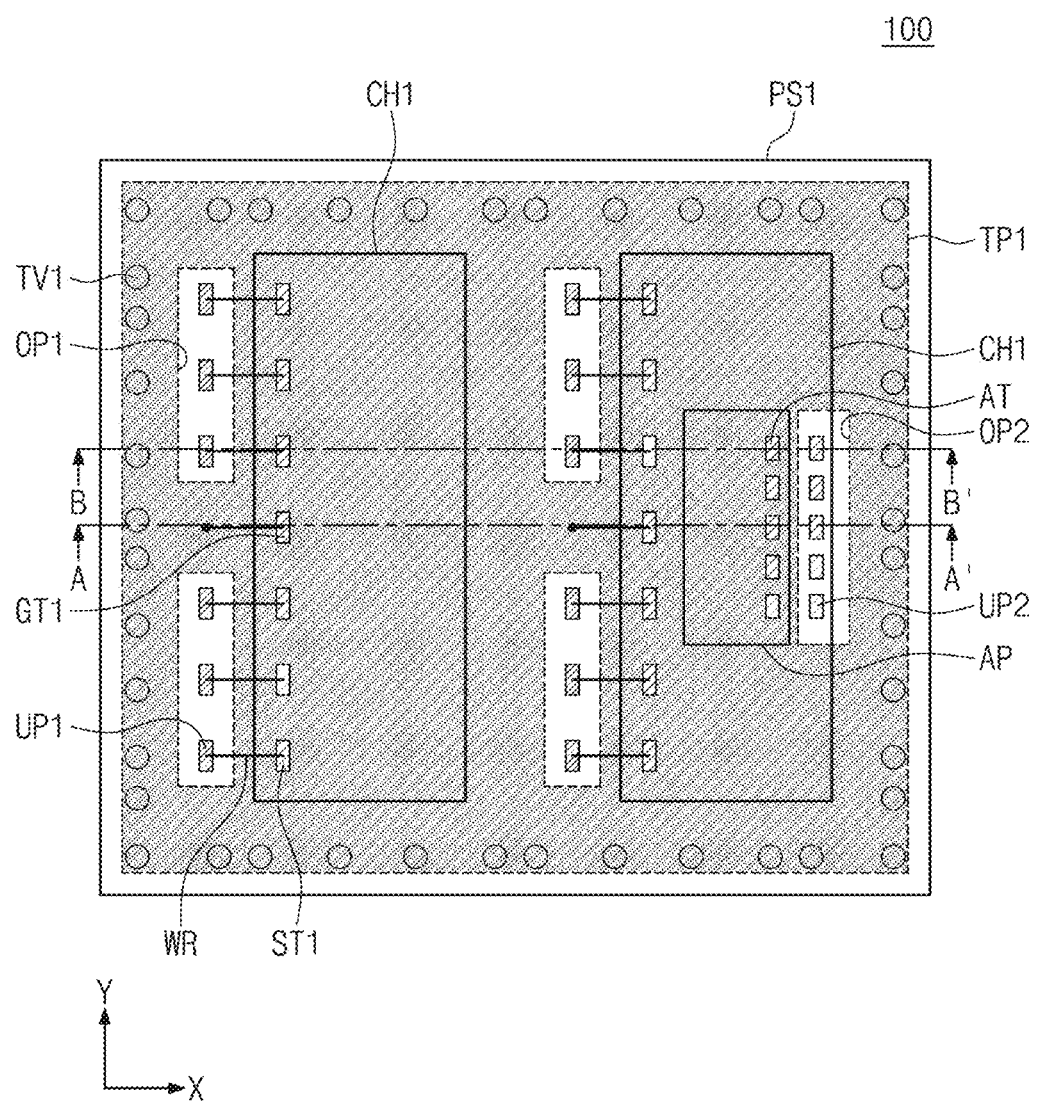
FIG. 1A illustrates a top view showing a semiconductor package according to an example embodiment of the present inventive concepts.
Figure 1B:
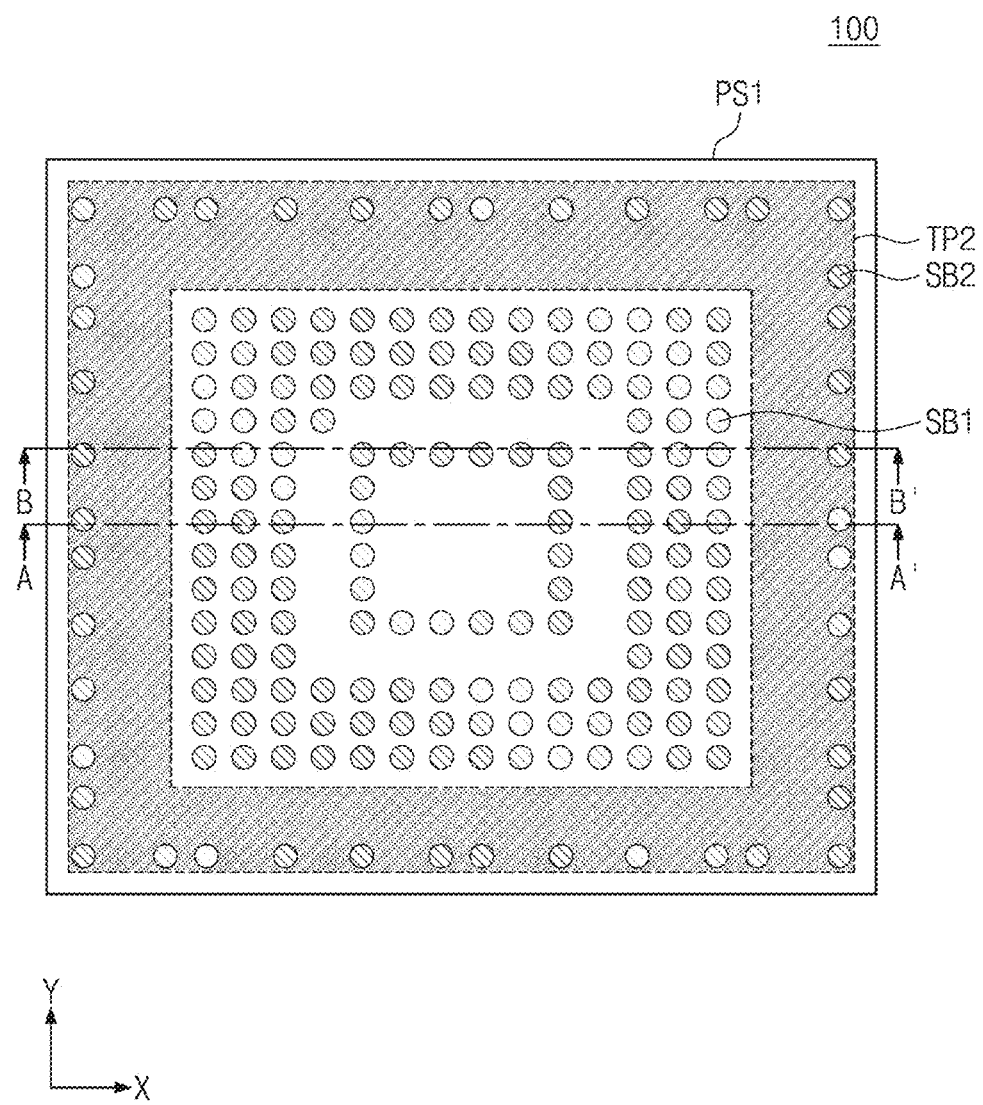
FIG. 1B illustrates a bottom view showing a semiconductor package according to an example embodiment of the present inventive concepts.
Figure 2A:
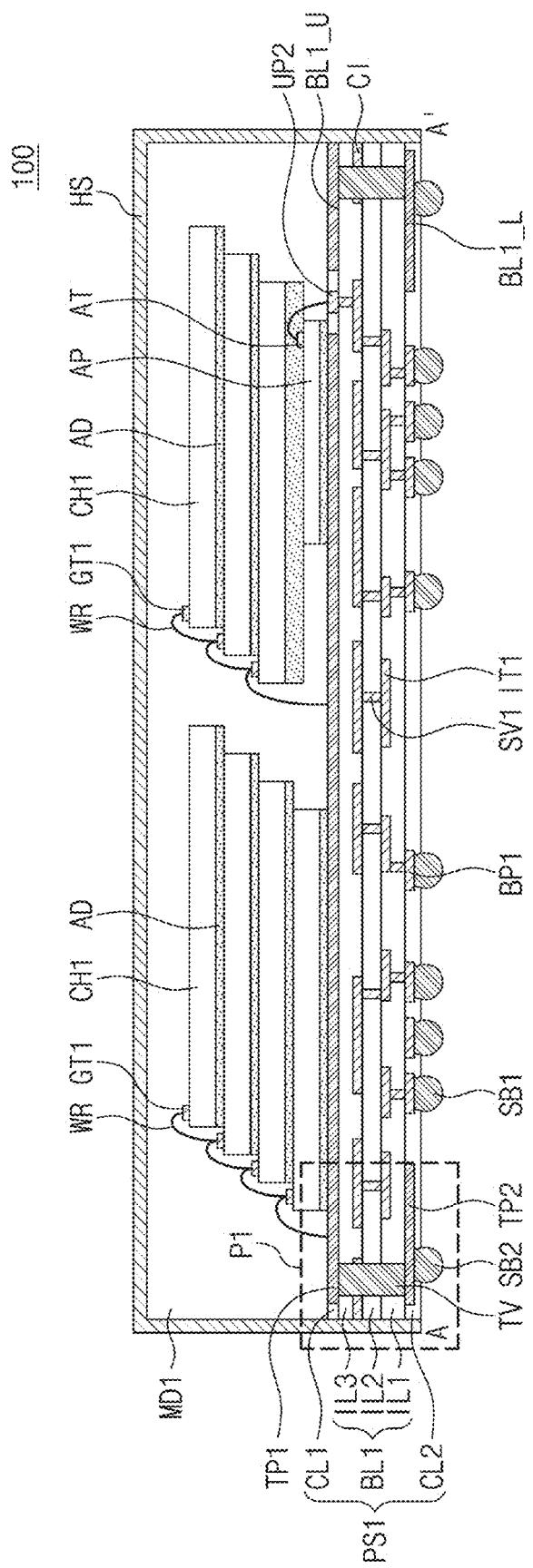
FIG. 2A illustrates a cross-sectional view taken along line A-A' of FIG. 1A or 1B.
Figure 2B:
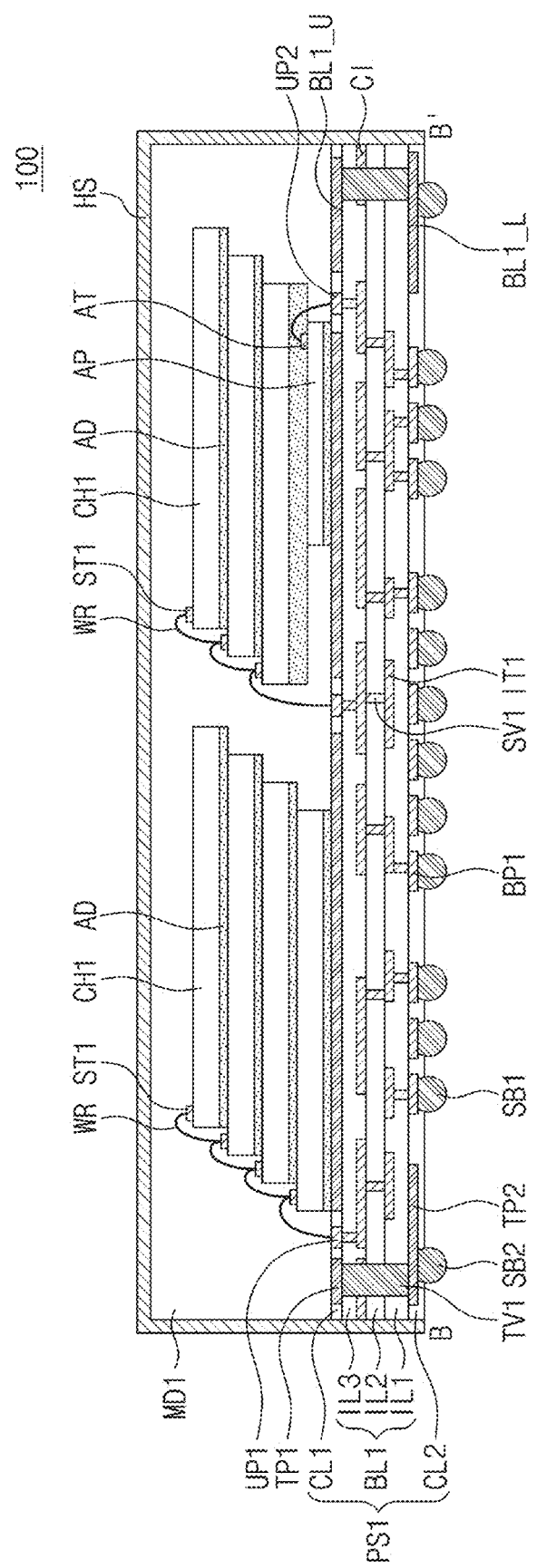
FIG. 2B illustrates a cross-sectional view taken along line B-B' of FIG. 1A or 1B.

FIG. 1A illustrates a top view showing a semiconductor package according to an example embodiment of the present inventive concepts. FIG. 1B illustrates a bottom view showing a semiconductor package according to an example embodiment of the present inventive concepts. FIG. 2A illustrates a cross-sectional view taken along line A-A' of FIG. 1A or 1B. FIG. 2B illustrates a cross-sectional view taken along line B-B' of FIG. 1A or 1B.

Referring to FIGS. 1A, 1B, 2A, and 2B, a semiconductor package 100 according to an example embodiment may include a first substrate PS1, first semiconductor devices CH1 and a second semiconductor device AP mounted on the first substrate PS1, and a first mold layer MD1 that covers sidewalls of the first semiconductor devices CH1 and a sidewall of the second semiconductor device AP. In this description, the first semiconductor device CH1 and the second semiconductor device AP may be respectively called a first semiconductor chip and a second semiconductor chip. The first substrate PS1 may be, for example, a multi-layered printed circuit board. The first substrate PS1 may include a first body layer BL1, a first protection layer CL1 that covers a top surface BL1_U of the first body layer BL1, and a second protection layer CL2 that covers a bottom surface BL1_B of the first body layer BL1. The first substrate PS1 may include first, second, and third dielectric layers IL1, IL2, and IL3 that are sequentially stacked. The first, second, and third dielectric layers ILL IL2, and IL3 may each include one or more of a thermosetting resin such as epoxy resin, a thermoplastic resin such as polyimide, a resin in which a thermosetting or thermoplastic resin is impregnated with a reinforcement such as glass fiber and/or inorganic filler (e.g., impregnated resin including a prepreg or a fire resist-4 (FR4)), and a photosensitive resin, but the present inventive concepts are not limited thereto. The first and second protection layers CL1 and CL2 may each be a photo-solder resist (PSR) layer.

The first body layer BL1 may be provided on its top surface BL1_U with a first thermal conductive plate TP1, first upper conductive pads UP1, and second upper conductive pads UP2. When viewed in a plan view as shown in FIG. 1A, the first thermal conductive plate TP1 may entirely cover the top surface BL1_U of the first body layer BL1, and may have first openings OP1 and second openings OP2 that expose the first upper conductive pads UP1 and the second upper conductive pads UP2, respectively. In the present example embodiment, the first thermal conductive plate TP1 may have a closed curve shape. The first thermal conductive plate TP1, the first upper conductive pads UP1, and the second upper conductive pads UP2 may include the same conductive material as each other. For example, the first thermal conductive plate TP1, the first upper conductive pads UP1, and the second upper conductive pads UP2 may include metal, such as copper, aluminum, nickel, and gold. In some example embodiments, the first thermal conductive plate TP1 may include a material whose thermal conductivity is better than that of a material included in the first upper conductive pads UP1 and that of a material included in the second upper conductive pads UP2. The first thermal conductive plate TP1 may have a thickness the same as or greater than that of the first upper conductive pads UP1 and that of the second upper conductive pads UP2.

A second thermal conductive plate TP2 and first lower conductive pads BP1 may be disposed on the bottom surface BL1_B of the first substrate PS1. When viewed in a plan view as shown in FIG. 1B, the second thermal conductive plate TP2 may surround the first lower conductive pads BP1 while being disposed along an edge of the first substrate PS1. The second thermal conductive plate TP2 may have a closed curve shape. The second thermal conductive plate TP2 and the first lower conductive pads BP1 may include the same conductive material as each other. For example, the second thermal conductive plate TP2 and the first lower conductive pads BP1 may include metal, such as copper, aluminum, nickel, and gold. In some example embodiments, the second thermal conductive plate TP2 may include a material whose thermal conductivity is better than that of a material included in the first lower conductive pads BP1. The second thermal conductive plate TP2 may have a thickness the same as or greater than that of the first lower conductive pads BP1.

The first substrate PS1 may be provided therein with first internal lines IT1 and first signal vias SV1 that connect the first internal lines IT1 to each other. The first signal vias SV1 may penetrate corresponding ones of the first, second, and third dielectric layers IL1, IL2, and IL3, respectively. The first lower conductive pads BP1 may be electrically connected through the first internal lines IT1 and the first signal vias SV1 to the first upper conductive pads UP1 or the second upper conductive pads UP2. A connection line CI may be disposed in the first substrate PS1. The connection line CI may be exposed on a sidewall of the first substrate PS1.

A plurality of external connection terminals SB1 and SB2 may be bonded beneath the first substrate PS1. A plurality of first external connection terminals SB1 may be bonded to corresponding ones of the first lower conductive pads BP1, respectively. A plurality of second external connection terminals SB2 may be bonded to the second thermal conductive plate TP2. As shown in FIG. 1B, the second external connection terminals SB2 may be linearly arranged along the edge of the first substrate PS1. In some example embodiments, the second external connection terminals SB2 may be arranged in a plurality of rows along the edge of the first substrate PS1.

The first and second external connection terminals SB1 and SB2 may each include at least one selected from solder balls, conductive bumps, and conductive pillars. The solder ball may include Sn or SnAg. The conductive bump or the conductive pillar may include copper.

Figure 3:
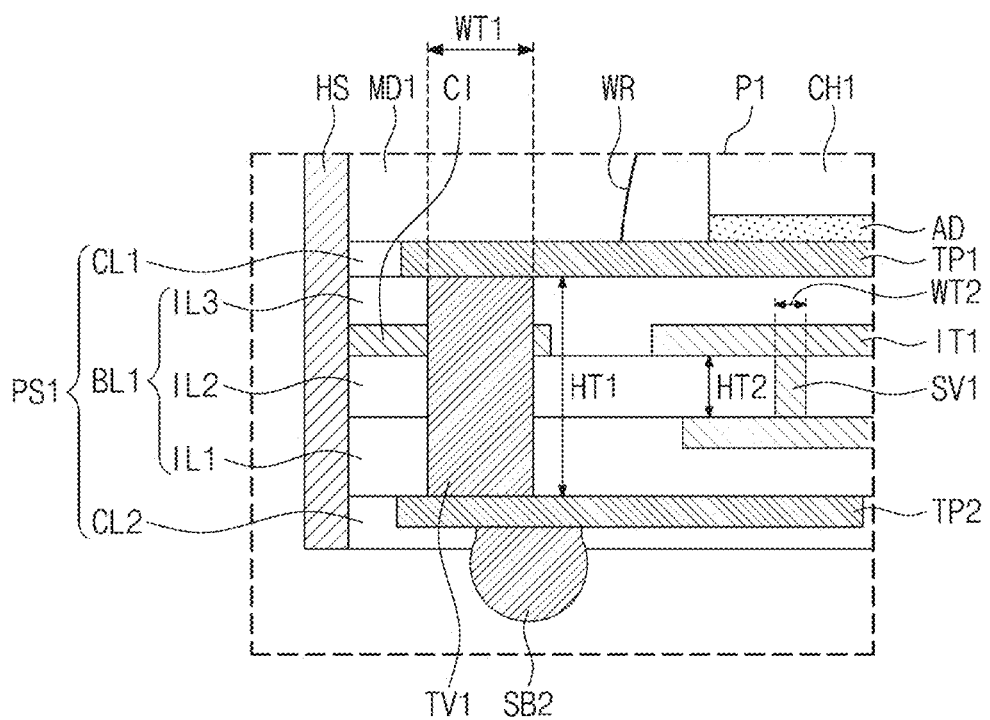
FIG. 3 illustrates an enlarged view showing section P1 of FIG. 2A.

FIG. 3 illustrates an enlarged view showing section P1 of FIG. 2A.

Referring to FIG. 3, the first substrate PS1 may be provided therein with a first thermal conductive via TV1 that connects the first thermal conductive plate TP1 to the second thermal conductive plate TP2. The first thermal conductive via TV1 may simultaneously penetrate the first, second, and third dielectric layers IL1, IL2, and IL3. The first thermal conductive via TV1 may penetrate the connection line CI. The first thermal conductive via TV1 may be in contact with the connection line CI. The first thermal conductive via TV1 may have a first width WT1 and a first vertical length HT1. Each or one of the first signal vias SV1 may have a second width WT2 and a second vertical length HT2. The first width WT1 may be equal to or greater than the second width WT2. The first vertical length HT1 may be the same as or greater than the second vertical length HT2. The first width WT1 may range, for example, from about 100 µm to about 500 µm. The first vertical length HT1 may range, for example, from 120 µm to 500 µm.

The first thermal conductive via TV1 may include the same material as that of the first signal vias SV1. The first thermal conductive via TV1 and the first signal vias SV1 may include, for example, copper. In some example embodiments, the first thermal conductive via TV1 may include a material whose thermal conductivity is better than that of a material included in the first signal vias SV1.

The first thermal conductive via TV1 may be provided in plural, and as shown in FIG. 1A, the plurality of first thermal conductive vias TV1 may be linearly arranged along the edge of the first substrate PS1. In some example embodiments, the plurality of first thermal conductive vias TV1 may be arranged in a plurality of rows along the edge of the first substrate PS1. At least one of the first thermal conductive vias TV1 may vertically overlap at least one of the second external connection terminals SB2.

The first semiconductor devices CH1 may be divided into two sets, and the two sets of the first semiconductor devices CH1 may be stacked on the first substrate PS1. The first semiconductor devices CH1 in each set may have their ends that constitute a stepwise shape, and terminals ST1 and GT1 may be exposed at the ends of the first semiconductor devices CH1. The first semiconductor devices CH1 may be memory chips of the same type, for example, flash memory chips, dynamic random access memory (DRAM) chips, static random access memory (SRAM) chips, electrically erasable programmable read-only memory (EEPROM) chips, phase change random access memory (PRAM) chips, magnetic random access memory (MRAM) chips, and resistive random access memory (ReRAM) chips. The second semiconductor device AP may be disposed beneath one set of the first semiconductor devices CH1. The second semiconductor device AP may be a logic chip that controls the first semiconductor devices CH1. The first semiconductor devices CH1 and the second semiconductor device AP may have their bottom surfaces that are covered with adhesion layers AD.

The terminals ST1 and GT1 of the first semiconductor devices CH1 may include first ground terminals GT1 and first signal terminals ST1. The first signal terminals ST1 may be input/output paths for electrical signals such as data signals, command signals, and access signals. Among the first signal terminals ST1 of the first semiconductor devices CH1, ones through which the same electrical signals are input and/or output may be connected in common to each other through one of wires WR and may be connected to one of the first upper conductive pads UP1.

The second semiconductor device AP may have second signal terminals AT. The second signal terminals AT may be input/output paths for electrical signals such as data signals, command signals, and access signals. One of the second signal terminals AT of the second semiconductor device AP may be connected to another of the wires WR and may be connected to one of the second upper conductive pads UP2. As shown in FIGS. 2A and 2B, the wire WR connected to the second semiconductor device AP may be inserted into the adhesion layer AD that immediately overlies the second semiconductor device AP. The adhesion layer AD into which the wire WR is inserted may be thickener than other adhesion layers AD. The adhesion layer AD may be dielectric and may include, for example, an epoxy material.

A ground voltage may be applied to the first ground terminals GT1. The first ground terminals GT1 of the first semiconductor devices CH1 in one set may be connected in common to each other through one of the wires WR and may be connected to the first thermal conductive plate TP1. Therefore, a ground voltage may also be applied to the first thermal conductive plate TP1.

The first mold layer MD1 may include a dielectric resin, such as an epoxy molding compound (EMC). The first mold layer MD1 may further include fillers, and the fillers may be dispersed in the dielectric resin. The first mold layer MD1 may be in contact with a top surface of the first thermal conductive plate TP1.

A shield layer HS may cover top and lateral surfaces of the first mold layer MD1 and a lateral surface of the first substrate PS1. The shield layer HS may include, for example, metal. The shield layer HS may also serve a thermal radiation member. Thus, in some example embodiments of the present inventive concepts, the shield layer HS may be referred to as a thermal radiation member.

Although not shown, a thermal interface material layer may be interposed between the shield layer HS and the top surface of the first mold layer MD1. The thermal interface material layer may include grease or a thermosetting resin layer. The thermal interface material layer may further include filler particles dispersed in the thermosetting resin layer. The filler particles may include a graphene powder or a metal powder whose thermal conductivity is high. In some example embodiments, the filler particles may include at least one selected from silica, alumina, zinc oxide, and boron nitride.

On the lateral surface of the first substrate PS1, the shield layer HS may be connected through the connection line CI to the first thermal conductive via TV1. Because a ground voltage is applied to the first thermal conductive plate TP1, a ground voltage may be applied to all of the first thermal conductive via TV1, the connection line CI, the shield layer HS, the second thermal conductive plate TP2, and the second connection terminals SB2. Therefore, the semiconductor package 100 may be perfectly electromagnetically shielded from external electromagnetic waves, and accordingly the semiconductor package 100 may be mitigated or prevented from malfunction and provided with increased reliability.

When the shield layer HS is not connected to the first thermal conductive via TV1, the semiconductor package 100 may be affected by effect/interference/interruption of external electromagnetic waves at a level of the first and second external connection terminals SB1 and SB2. However, some example embodiments of the present inventive concepts may solve such problems.

Further, heat generated from the first and second semiconductor devices CH1 and AP may be promptly outwardly discharged through the first thermal conductive plate TP1, the first thermal conductive via TV1, the second thermal conductive plate TP2, and the second external connection terminals SB2. Therefore, it may be possible to mitigate or prevent malfunction due to overheating of the first and second semiconductor devices CH1 and AP and increase reliability of the semiconductor package 100. Because the first thermal conductive plate TP1 is disposed adjacent to a top surface of the first substrate PS1, the first thermal conductive plate TP1 may be disposed close to the first and second semiconductor devices CH1 and AP, and thus thermal radiation may be easily achieved. Moreover, because the first thermal conductive via TV1 has the first width WT1 and the first vertical length HT1 greater than the second width WT2 and the second vertical length HT2 of the first signal vias SV1, thermal radiation may be easily and promptly accomplished. The heat may be delivered through the connection line CI to the shield layer HS, thereby being outwardly discharged.

Figure 4:
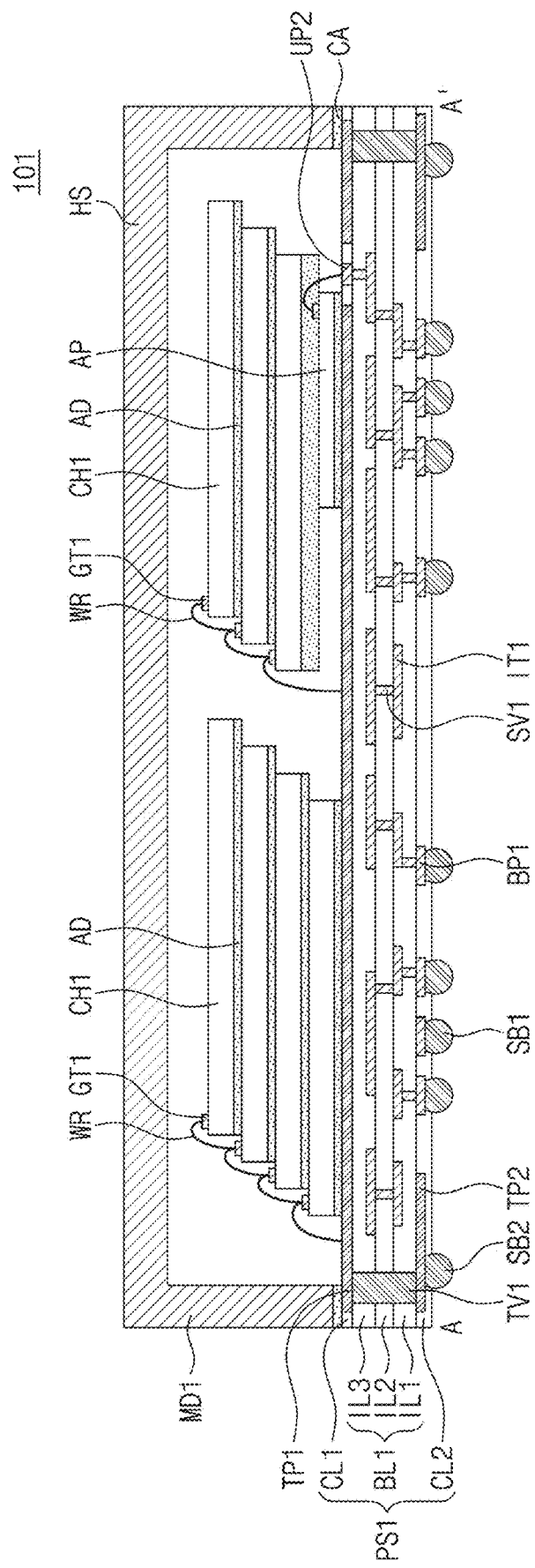
FIG. 4 illustrates a cross-sectional view taken along line A-A' of FIG. 1A or 1B.

FIG. 4 illustrates a cross-sectional view taken along line A-A' of FIG. 1A or 1B.

Referring to FIG. 4, a semiconductor package 101 according to the present example embodiment may be configured such that a bottom end of the shield layer HS may be adjacent to the top surface of the first substrate PS1. The shield layer HS may not cover but expose the lateral surface of the first substrate PS1. A conductive adhesion layer CA may be interposed between the bottom end of the shield layer HS and the top surface of the first substrate PS1. The conductive adhesion layer CA may have conductive particles dispersed therein. The conductive adhesion layer CA may be in contact with the top surface of the first thermal conductive plate TP1. The shield layer HS may be electrically connected through the conductive adhesion layer CA to the first thermal conductive plate TP1. Therefore, a ground voltage may be applied to the shield layer HS. The semiconductor package 101 according to the present example embodiment may exclude the connection line CI of FIG. 2A. Other configurations may be identical or similar to those discussed above.

Figure 5:
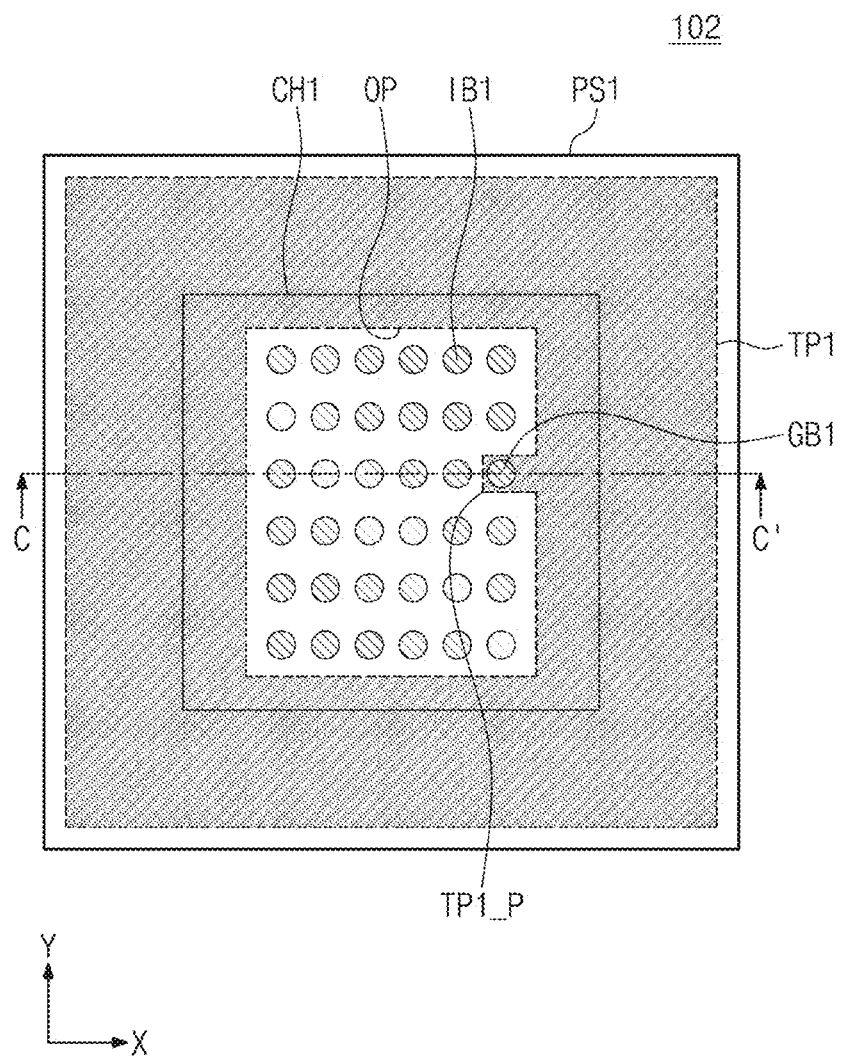
FIG. 5 illustrates a plan view showing a semiconductor package according to an example embodiment of the present inventive concepts.
Figure 6:
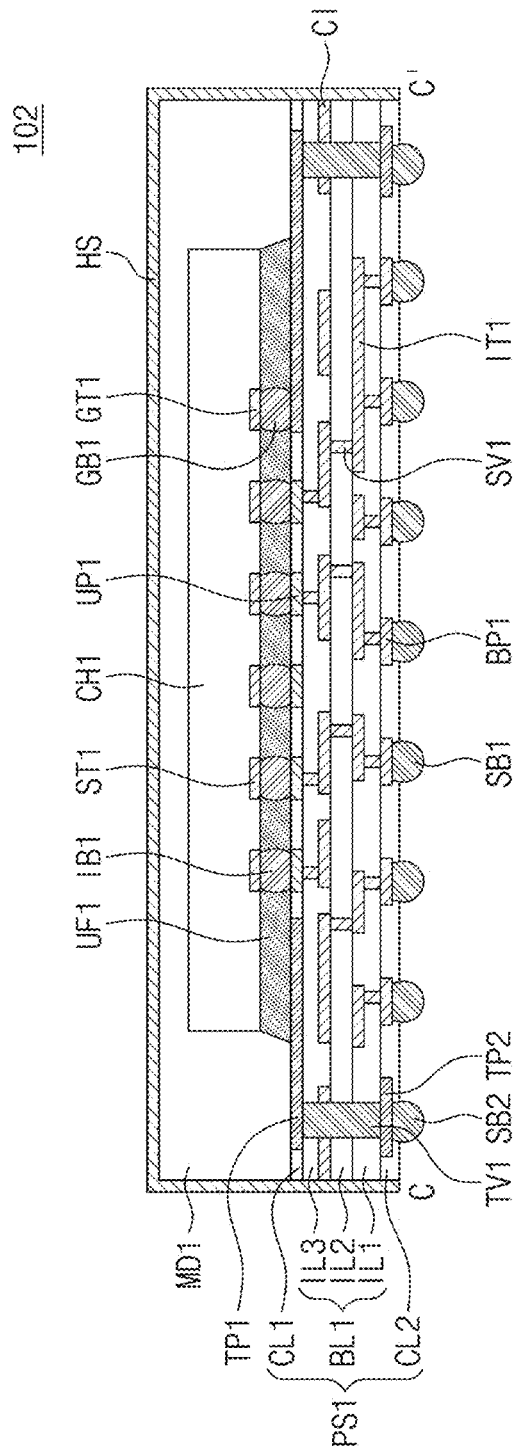
FIG. 6 illustrates a cross-sectional view taken along line C-C' of FIG. 5.

FIG. 5 illustrates a plan view showing a semiconductor package according to an example embodiment of the present inventive concepts. FIG. 6 illustrates a cross-sectional view taken along line C-C' of FIG. 5.

Referring to FIGS. 5 and 6, a semiconductor package 102 according to the present example embodiment may be configured such that the first substrate PS1 may be identical or similar to that discussed above. The first semiconductor device CH1 may be flip-chip bonded to the first substrate PS1 through first internal connection members IB1 and GB1. The semiconductor package 102 may exclude the second semiconductor device AP of FIG. 2A. The first semiconductor device CH1 may be one selected from an image sensor chip such as a complementary metal oxide semiconductor (CMOS) image sensor (CIS), a microelectromechanical system (MEMS) device chip, an application specific integrated circuit (ASIC) chip, and a memory device chip such as a flash memory, a dynamic random access memory (DRAM), a static random access memory (SRAM), an electrically erasable programmable read-only memory (EEPROM), a phase change random access memory (PRAM), a magneto-resistive random access memory (MRAM), a resistive random access memory (ReRAM), a high bandwidth memory (HBM), and a hybrid memory cubic (HMC).

The first internal connection members IB1 and GB1 may each include at least one selected from solder balls, conductive bumps, and conductive pillars. The solder ball may include Sn or SnAg. The conductive bump or the conductive pillar may include copper. The first internal connection members IB1 and GB1 may include first signal internal connection members IB1 and a first ground internal connection member GB1. The first ground internal connection member GB1 may connect the first ground terminal GT1 of the first semiconductor device CH1 to the first thermal conductive plate TP1. The first signal internal connection members IB1 may connect corresponding ones of the first signal terminals ST1 of the first semiconductor device CH1 to the first upper conductive pads UP1, respectively.

When viewed in a plan view as shown in FIG. 5, the first thermal conductive plate TP1 may have a closed curve shape having an opening that exposes the first signal internal connection members IB1. The first thermal conductive plate TP1 may include a protrusion TP1_P that protrudes toward the first ground internal connection member GB1. The first thermal conductive plate TP1 may partially overlap the first semiconductor device CH1.

A first under-fill layer UF1 may be interposed between the first semiconductor device CH1 and the first substrate PS1. The first under-fill layer UF1 may include a thermo-curable resin or a photo-curable resin. Further, the first under-fill layer UF1 may further include organic fillers or inorganic fillers. The first under-fill layer UF1 may be in contact with the top surfaces of the first thermal conductive plate TP1. Other configurations may be identical or similar to those discussed above.

Figure 7A:
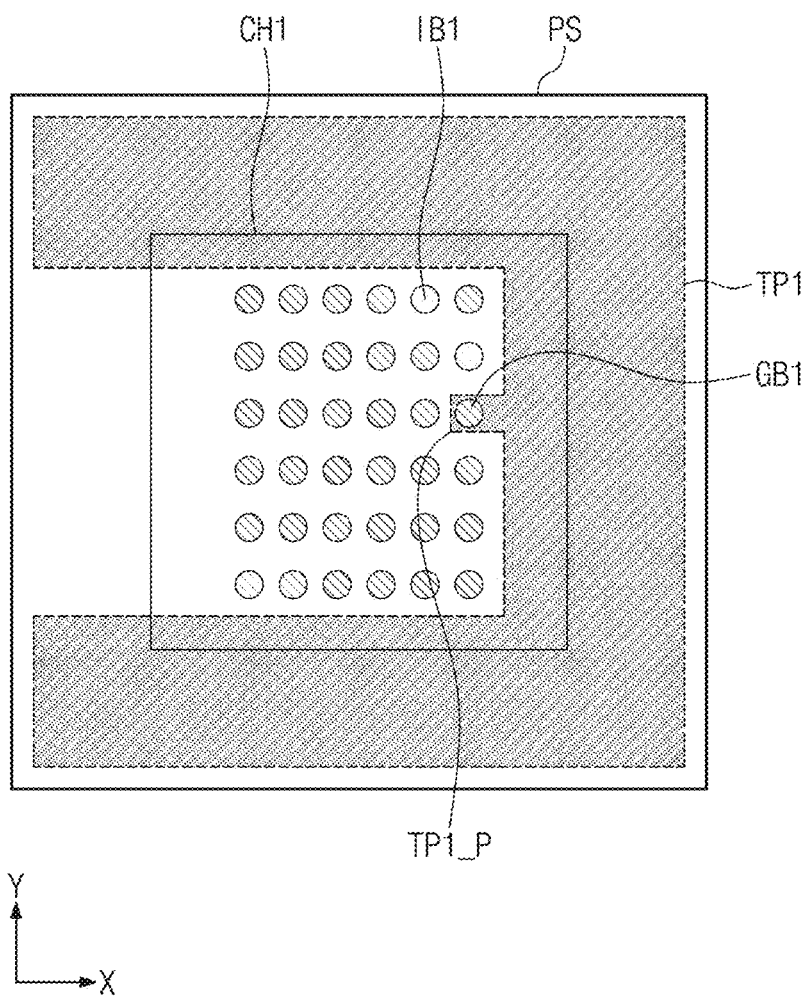
FIGS. 7A to 7C illustrate plan views showing a semiconductor package according to some example embodiments of the present inventive concepts.
Figure 7B:
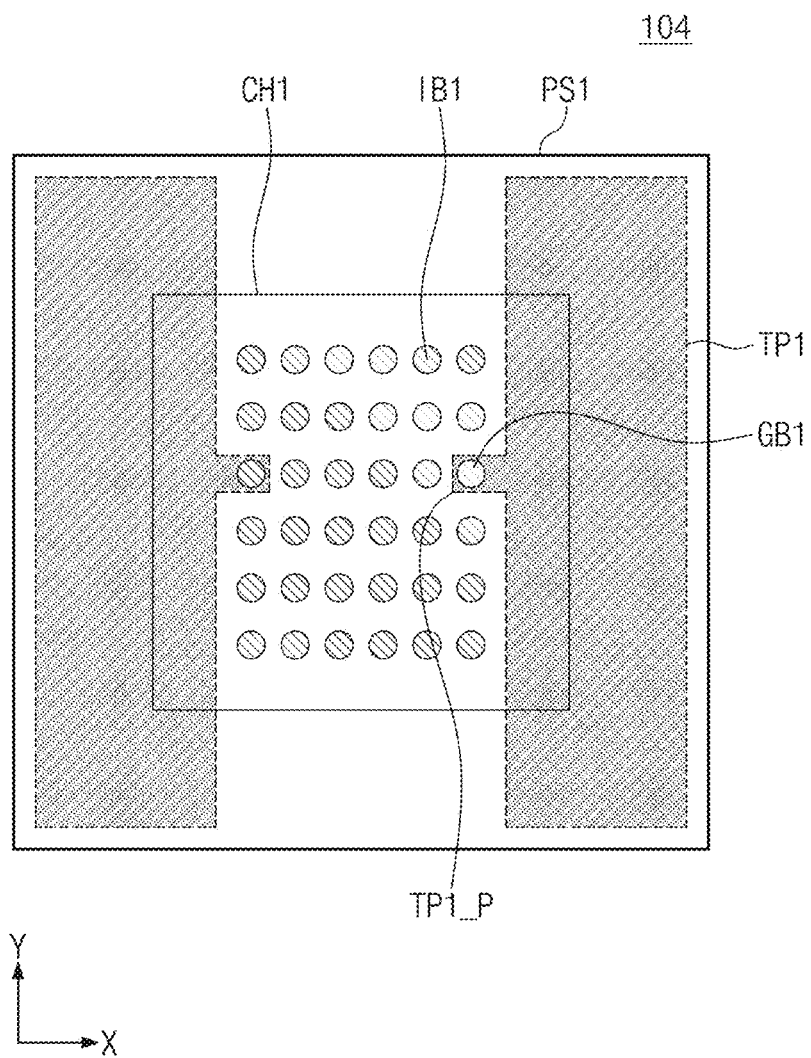
Figure 7C:
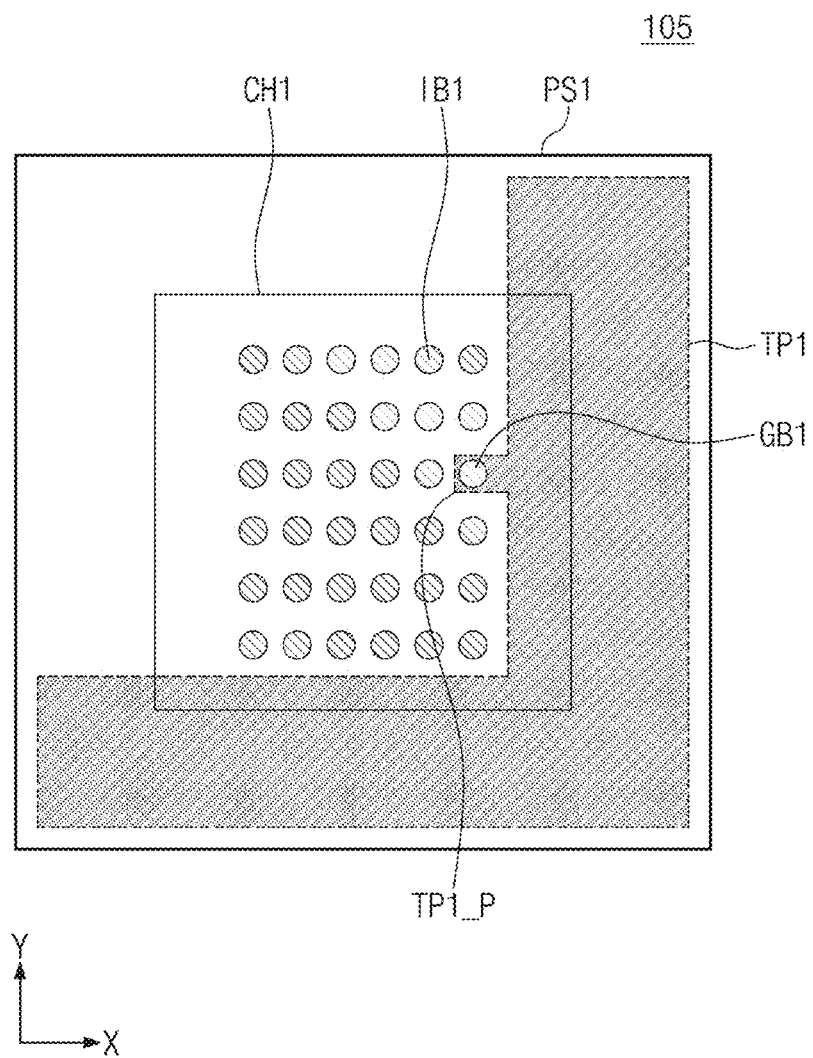

FIGS. 7A to 7C illustrate plan views showing a semiconductor package according to some example embodiments of the present inventive concepts.

Referring to FIG. 7A, a semiconductor package 103 according to the an example embodiment may be configured such that the first thermal conductive plate TP1 may be shaped like C when viewed in a plan view. Other configurations may be identical or similar to those discussed above.

Referring to FIG. 7B, a semiconductor package 104 according to an example embodiment may be configured such that the first thermal conductive plate TP1 may be shaped like T when viewed in a plan view and may be provided in plural. The first thermal conductive plate TP1 may be spaced apart in a first direction X from each other across the first signal internal connection members IB1. Other configurations may be identical or similar to those discussed above.

Referring to FIG. 7C, a semiconductor package 105 according to an example embodiment may be configured such that the first thermal conductive plate TP1 may be shaped like L when viewed in a plan view. Other configurations may be identical or similar to those discussed above.

Figure 8:
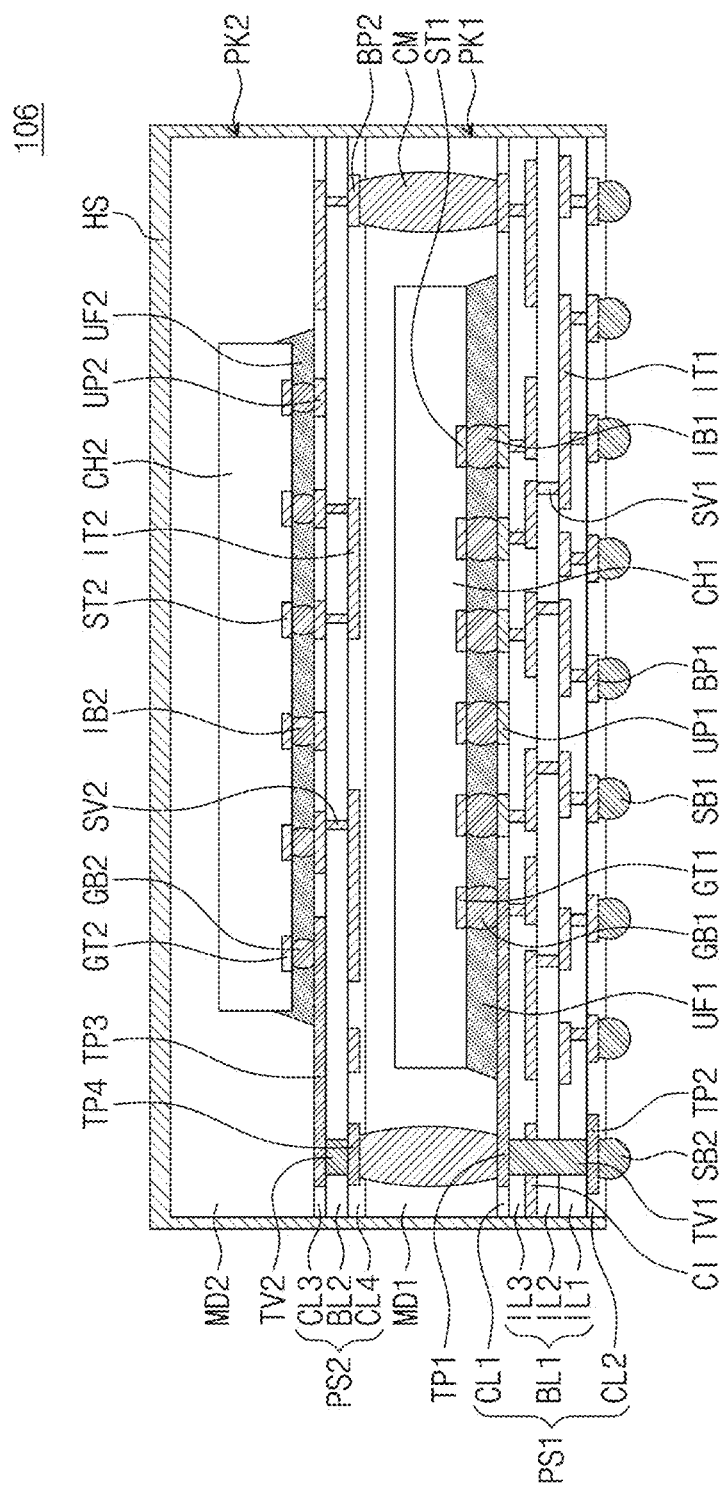
FIG. 8 illustrates a cross-sectional view showing a semiconductor package according to an example embodiment of the present inventive concepts.

FIG. 8 illustrates a cross-sectional view showing a semiconductor package according to an example embodiment of the present inventive concepts.

Referring to FIG. 8, a semiconductor package 106 according to the present example embodiment may have a package-on-package structure in which a second sub-semiconductor package PK2 may be mounted on a first sub-semiconductor package PK1. The first sub-semiconductor package PK1 may have a similar structure to that of the semiconductor package 102 without the shield layer HS shown in FIG. 6. When viewed in a plan view, the first thermal conductive plate TP1 may be shaped like C of FIG. 7A or shaped like L of FIG. 7C.

The second sub-semiconductor package PK2 may include a second substrate PS2, a second semiconductor device CH2 disposed on the second substrate PS2, and a second mold layer MD2 that covers the second substrate PS2 and the second semiconductor device CH2. The second substrate PS2 may be, for example, a double-sided printed circuit board. The second substrate PS2 may include a second body layer BL2, a third protection layer CL3 that covers a top surface of the second body layer BL2, and a fourth protection layer CL4 that covers a bottom surface of the second body layer BL2.

For example, the substrate body layer BL2 may include one or more of a thermosetting resin such as epoxy resin, a thermoplastic resin such as polyimide, a resin in which a thermosetting or thermoplastic resin is impregnated with a reinforcement such as glass fiber and/or inorganic filler (e.g., impregnated resin including a prepreg or a fire resist-4 (FR4)), and a photosensitive resin, but the present inventive concepts are not limited thereto. The third and fourth protection layers CL3 and CL4 may each be a photo-solder resist (PSR) layer.

The second mold layer MD2 may include a dielectric resin, such as an epoxy molding compound (EMC). The second mold layer MD2 may further include fillers, and the fillers may be dispersed in the dielectric resin. The second mold layer MD2 may be in contact with a top surface of a third thermal conductive plate TP3 which will be discussed below.

The second body layer BL2 may be provided on its top surface with second upper conductive pads UP2 and a third thermal conductive plate TP3. The second body layer BL2 may be provided on its bottom surface with second lower conductive pads BP2, second internal lines IT2, and a fourth thermal conductive plate TP4.

The third thermal conductive plate TP3 and the second upper conductive pads UP2 may include the same conductive material as each other. For example, the third thermal conductive plate TP3 and the second upper conductive pads UP2 may include metal, such as copper, aluminum, nickel, and gold. In some example embodiments, the third thermal conductive plate TP3 may include a material whose thermal conductivity is better than that of a material included in the second upper conductive pads UP2. When viewed in a plan view, the third thermal conductive plate TP3 may be shaped like C of FIG. 7A or shaped like L of FIG. 7C.

The fourth thermal conductive plate TP4, the second lower conductive pads BP2, and the second internal lines IT2 may include the same conductive material as each other. For example, the fourth thermal conductive plate TP4, the second lower conductive pads BP2, and the second internal lines IT2 may include metal, such as copper, aluminum, nickel, and gold. In some example embodiments, the fourth thermal conductive plate TP4 may include a material whose thermal conductivity is better than that of a material included in the second lower conductive pads BP2 and that of a material included in the second internal lines IT2. When viewed in a plan view, the fourth thermal conductive plate TP4 may be shaped like C of FIG. 7A or shaped like L of FIG. 7C.

The second body layer BL2 may be penetrated by second signal vias SV2 and a second thermal conductive via TV2. The second thermal conductive via TV2 may have a width the same as or greater than that of the second signal via SV2. The second thermal conductive via TV2 may have a vertical length the same as that of the second signal via SV2.

The second thermal conductive via TV2 may include the same material as that of the second signal vias SV2. The second thermal conductive via TV2 and the second signal via SV2 may include, for example, copper. In some example embodiments, the second thermal conductive via TV2 may include a material whose thermal conductivity is better than that of a material included in the second signal via SV2. The second thermal conductive via TV2 may be provided in plural, and the plurality of second thermal conductive vias TV2 may be arranged along an edge of the second substrate PS2.

The second semiconductor device CH2 may be one selected from an image sensor chip such as CMOS image sensor (CIS), a microelectromechanical system (MEMS) device chip, an application specific integrated circuit (ASIC) chip, and a memory device chip such as Flash memory, DRAM, SRAM, EEPROM, PRAM, MRAM, ReRAM, HBM (high bandwidth memory), and HMC (hybrid memory cubic).

The second semiconductor device CH2 may have second signal terminals ST2 and a second ground terminal GT2. The second signal terminals ST2 may be input/output paths for electrical signals such as data signals, command signals, and access signals. A ground voltage may be applied to the second ground terminal GT2.

The second signal terminals ST2 may be connected to the second upper conductive pads UP2 through second signal internal connection members IB2. The second ground terminals GT2 may be connected to the third thermal conductive plate TP3 through second ground internal connection members GB2. Therefore, a ground voltage may be applied to the third thermal conductive plate TP3, the second thermal conductive via TV2, and the fourth thermal conductive plate TP4.

The first sub-semiconductor package PK1 may include through connection structures CM that penetrate the first mold layer MD1. The through connection structures CM may electrically connect the first substrate PS1 to the second substrate PS2. One of the through connection structures CM may connect one of the first upper conductive pads UP1 to one of the second lower conductive pads BP2. Another of the through connection structures CM may connect the first thermal conductive plate TP1 to the fourth thermal conductive plate TP4.

The shield layer HS may cover top and lateral surfaces of the second sub-semiconductor package PK2 and a lateral surface of the first sub-semiconductor package PK1.

Other configurations may be identical or similar to those discussed above.

Figure 9:
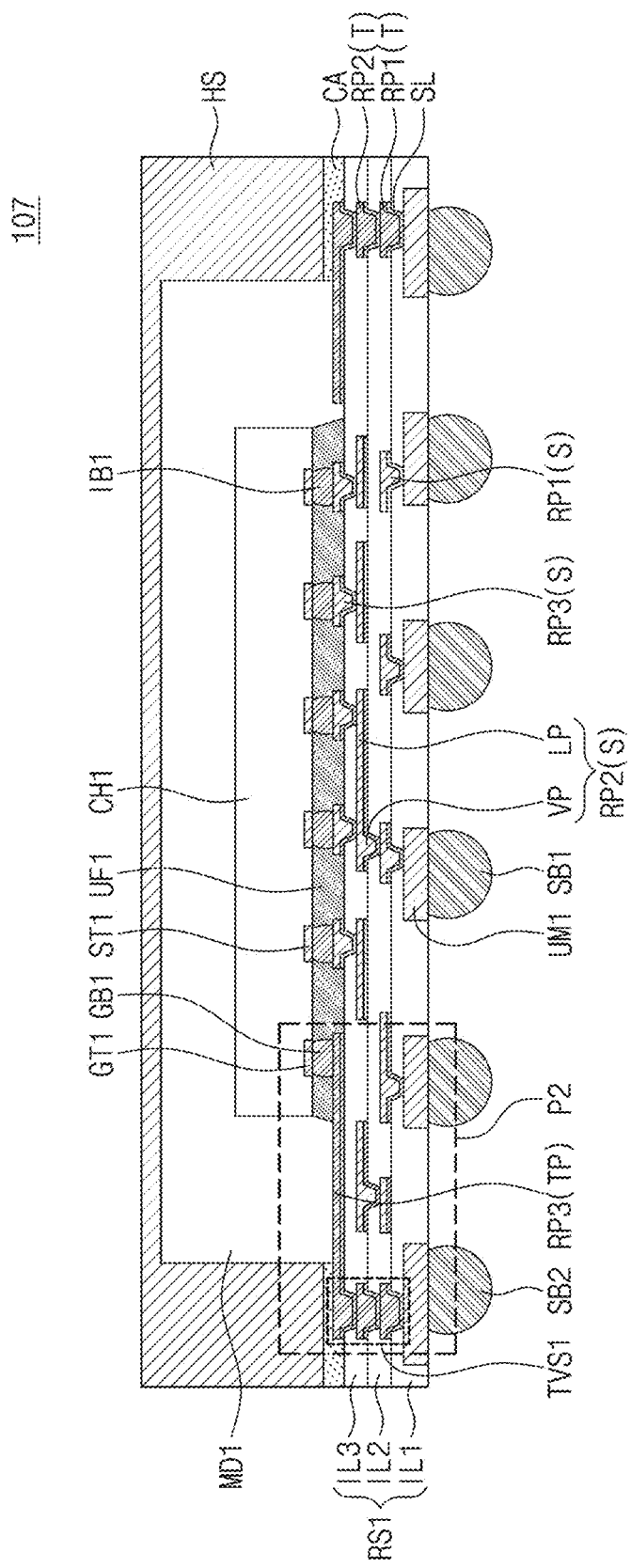
FIG. 9 illustrates a cross-sectional view showing a semiconductor package according to an example embodiment of the present inventive concepts.
Figure 10:
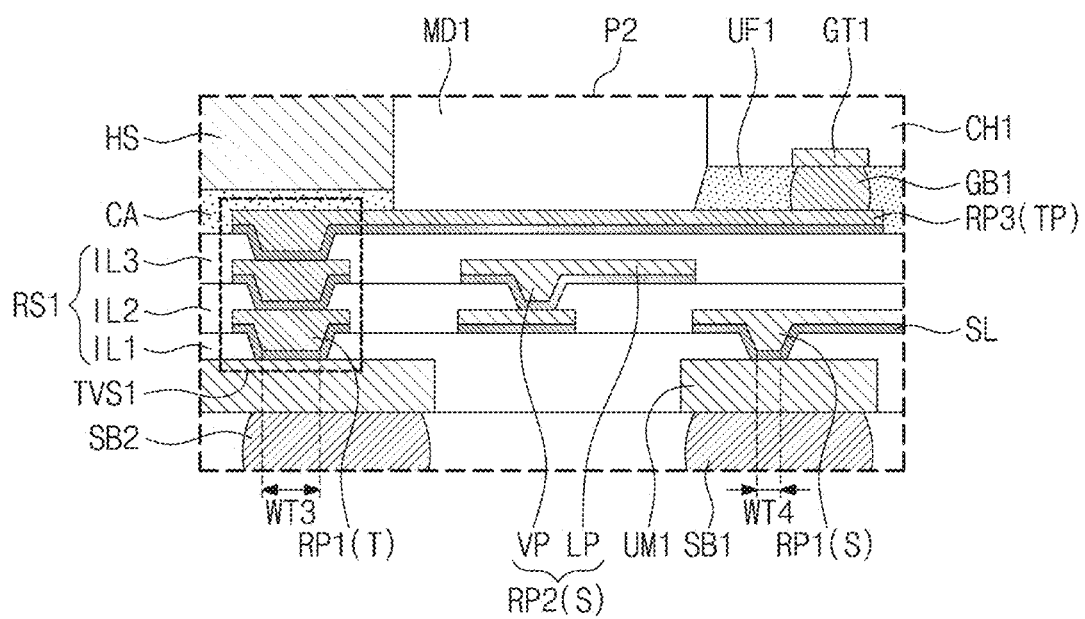
FIG. 10 illustrates an enlarged cross-sectional view showing section P2 of FIG. 9.

FIG. 9 illustrates a cross-sectional view showing a semiconductor package according to an example embodiment of the present inventive concepts. FIG. 10 illustrates an enlarged cross-sectional view showing section P2 of FIG. 9.

Referring to FIGS. 9 and 10, a semiconductor package 107 according to the present example embodiment may have a structure of chip-last type fan-out wafer level package (FOWLP). A first semiconductor device CH1 may be mounted on a first substrate RS1. The first substrate RS1 may be, for example, a redistribution substrate. The first substrate RS1 may include, for example, first, second, and third dielectric layers IL1, IL2, and IL3 that are sequentially stacked. The first, second, and third dielectric layers IL1, IL2, and IL3 may each be a photo-imagable dielectric (PID).

The first dielectric layer IL1 may have first under-bumps UM1 disposed therein. The first dielectric layer IL1 and the second dielectric layer IL2 may be provided therebetween with first redistribution patterns RP1. The second dielectric layer IL2 and the third dielectric layer IL3 may be provided therebetween with second redistribution patterns RP2. The third dielectric layer IL3 may be provided thereon with third redistribution patterns RP3. The first, second, and third redistribution patterns RP1, RP2, and RP3 may have their bottom surfaces each of which is covered with a barrier/seed pattern SL. The barrier/seed pattern SL may include, for example, at least one selected from titanium, titanium nitride, tantalum, and tantalum nitride. The first, second, and third redistribution patterns RP1, RP2, and RP3 may include, for example, copper. The first, second, and third redistribution patterns RP1, RP2, and RP3 each may include a via part VP and a line part LP that are integrally connected into a single unitary piece. The via part VP may be disposed beneath the line part LP. The via parts VP may be inserted into corresponding ones of the first, second, and third dielectric layers ILL IL2, and IL3, respectively.

The first redistribution patterns RP1 may include first signal redistribution patterns RP1(S) and first thermal conductive redistribution patterns RP1(T). The second redistribution patterns RP2 may include second signal redistribution patterns RP2(S) and second thermal conductive redistribution patterns RP2(T). The third redistribution patterns RP3 may include third signal redistribution patterns RP3(S) and third thermal conductive redistribution patterns RP3(TP).

The via parts VP of the first, second, and third thermal conductive redistribution patterns RP1(T), RP2(T), and RP3(TP) may vertically overlap each other to constitute a first thermal conductive via structure TVS1. The first thermal conductive via structure TVS1 may correspond to the first thermal conductive via TV1 discussed above. The via parts VP of the first, second, and third thermal conductive redistribution patterns RP1(T), RP2(T), and RP3(TP) each may be referred to as a sub-via. The via parts VP of the first, second, and third thermal conductive redistribution patterns RP1(T), RP2(T), and RP3(TP) may have their bottom surfaces, each of which has a third width WT3 as shown in FIG. 10.

When viewed in a plan view, the line part LP of the third thermal conductive redistribution pattern RP3(TP) may have a shape the same as that of the first thermal conductive plate TP1 discussed with reference to FIGS. 5 and 7A to 7C. The line part LP of the third thermal conductive redistribution pattern RP3(TP) may correspond to the first thermal conductive plate TP1 discussed with reference to FIGS. 5 and 7A to 7C.

The via parts VP of the first, second, and third signal redistribution patterns RP1(S), RP2(S), and RP3(S) may have their bottom surfaces, each of which has a fourth width WT4 as shown in FIG. 10. The third width WT3 may be the same as or greater than the fourth width WT4.

The first signal terminals ST1 of the first semiconductor device CH1 may be connected through the first signal internal connection members IB1 to the third signal redistribution patterns RP3(S). The first ground terminals GT1 of the first semiconductor device CH1 may be connected through the first ground internal connection members GB1 to the third thermal conductive redistribution patterns RP3(TP). A ground voltage may be applied to the first, second, and third thermal conductive redistribution patterns RP1(T), RP2(T), and RP3(TP).

The shield layer HS may have a bottom end adjacent to a top surface of the first substrate RS1. A conductive adhesion layer CA may be interposed between the first substrate RS1 and the bottom end of the shield layer HS. The conductive adhesion layer CA may be in contact with a top surface of the third thermal conductive redistribution pattern RP3(TP). The shield layer HS may be electrically connected through the conductive adhesion layer CA to the third thermal conductive pattern RP3(TP). Other configurations may be identical or similar to those discussed above.

Figure 11:
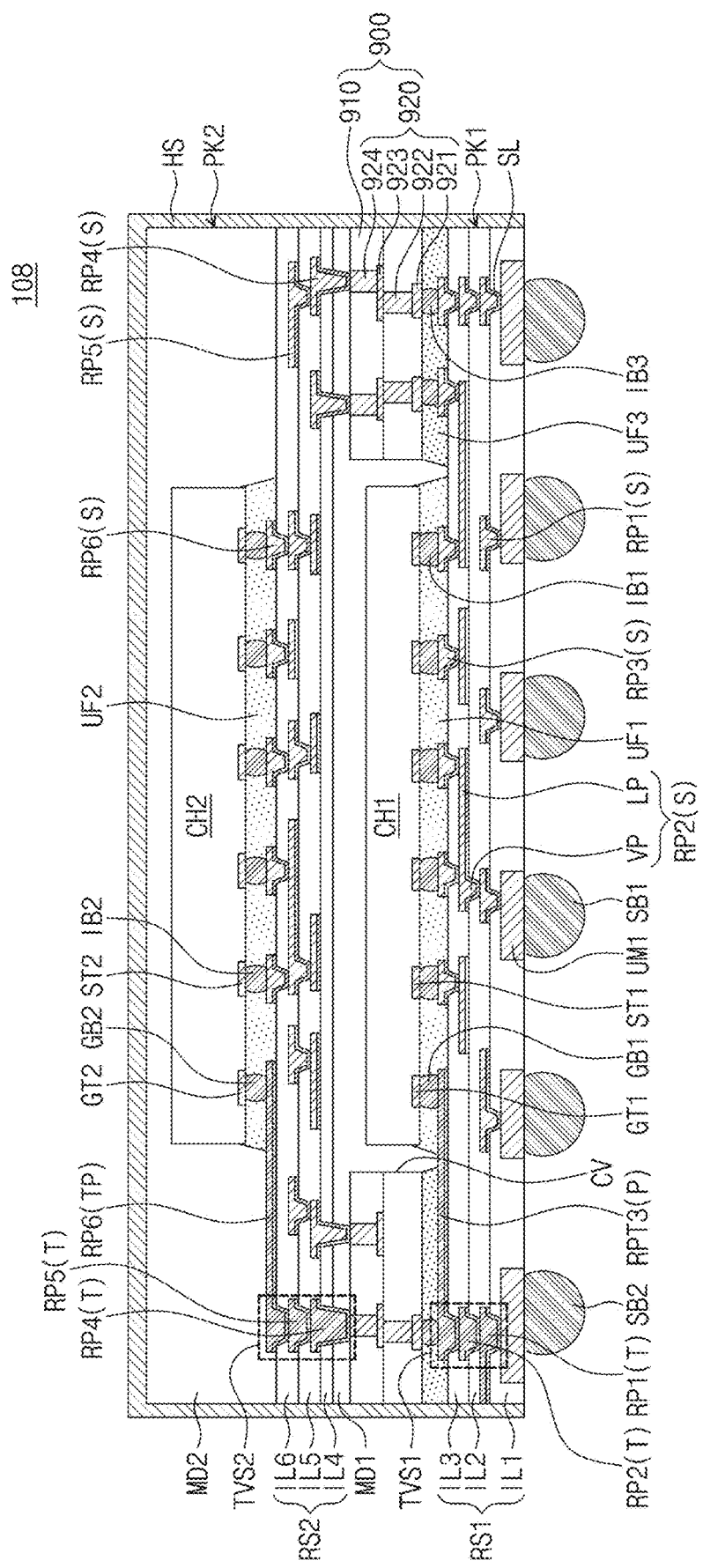
FIG. 11 illustrates a cross-sectional view showing a semiconductor package according to an example embodiment of the present inventive concepts.

FIG. 11 illustrates a cross-sectional view showing a semiconductor package according to an example embodiment of the present inventive concepts.

Referring to FIG. 11, a semiconductor package 108 according to the present example embodiment may have a package-on-package structure in which a second sub-semiconductor package PK2 may be stacked on a first sub-semiconductor package PK1. The first sub-semiconductor package PK1 may have a structure of chip-last type fan-out panel level package (FOPLP). The first sub-semiconductor package PK1 may have the same structure as or a similar structure to that of the semiconductor package 107 discussed with reference to FIG. 9. For the first sub-semiconductor package PK1, the line part LP of the first thermal conductive redistribution pattern RP1(T) may have a portion that extends toward and is exposed on a sidewall of the first substrate RS1. The shield layer HS may cover a top surface and a sidewall of the second sub-semiconductor package PK2 and a sidewall of the first sub-semiconductor package PK1. The shield layer HS may be in contact with the line part LP of the first thermal conductive redistribution pattern RP1(T).

The first sub-semiconductor package PK1 may further include a connection substrate 900. The connection substrate 900 may be disposed on the first substrate RS1. The connection substrate 900 may include a cavity region CV at a center or a central area thereof. The first semiconductor device CH1 may be disposed in the cavity region CV. The connection substrate 900 may include a plurality of base layers 910 and a plurality of conductive structures 920. The base layers 910 may include a dielectric material. For example, the base layers 910 may include a carbon-based material, a ceramic, or a polymer. The conductive structure 920 may include a connection pad 921, a first connection via 922, a connection line 923, and a second connection via 924.

The connection substrate 900 may be connected through third internal connection members IB3 to the first substrate RS1. A third under-fill layer UF3 may be interposed between the connection substrate 900 and the first substrate RS1. The first mold layer MD1 may fill a space between the first semiconductor device CH1 and an inner sidewall of the cavity region CV of the connection substrate 900. The first mold layer MD1 may cover the first semiconductor device CH1 and the connection substrate 900.

The second sub-semiconductor package PK2 may include a second substrate RS2 and a second semiconductor device CH2 stacked on the second substrate RS2. The second substrate RS2 may be, for example, a redistribution substrate. The second substrate RS2 may include, for example, fourth, fifth, and sixth dielectric layers IL4, IL5, and IL6 that are sequentially stacked. The fourth, fifth, and sixth dielectric layers IL4, IL5, and IL6 may each be a photo-imageable dielectric (PID).

The fourth dielectric layer IL4 and the fifth dielectric layer IL5 may be provided therebetween with fourth redistribution patterns RP4. The fifth dielectric layer IL5 and the sixth dielectric layer IL6 may be provided therebetween with fifth redistribution patterns RP5. The sixth dielectric layer IL6 may be provided thereon with sixth redistribution patterns RP6. The fourth, fifth, and sixth redistribution patterns RP4, RP5, and RP6 may have their bottom surfaces, each of which is covered with a barrier/seed pattern SL. The barrier/seed pattern SL may include, for example, at least one selected from titanium, titanium nitride, tantalum, and tantalum nitride. The fourth, fifth, and sixth redistribution patterns RP4, PR5, and RP6 may include, for example, copper. The fourth, fifth, and sixth redistribution patterns RP4, RP5, and RP6 each may include a via part VP and a line part LP that are integrally connected into a single unitary piece. The via part VP may be disposed beneath the line part LP. The via parts VP may be inserted into corresponding ones of the fourth, fifth, and sixth dielectric layers IL4, IL5, and IL6, respectively. The via part VP of the fourth redistribution pattern RP4 may penetrate the fourth dielectric layer IL4 and the first mold layer MD1 to connect with the second connection via 924 of the connection substrate 900.

The fourth redistribution patterns RP4 may include fourth signal redistribution patterns RP4(S) and fourth thermal conductive redistribution patterns RP4(T). The fifth redistribution patterns RP5 may include fifth signal redistribution patterns RP5(S) and fifth thermal conductive redistribution patterns RP5(T). The sixth redistribution patterns RP6 may include sixth signal redistribution patterns RP6(S) and sixth thermal conductive redistribution patterns RP6(TP).

The via parts VP of the fourth, fifth, and sixth thermal conductive redistribution patterns RP4(T), RP5(T), and RP6(TP) may vertically overlap each other to constitute a second thermal conductive via structure TVS2. The second thermal conductive via structure TVS2 may correspond to the second thermal conductive via TV2 discussed with reference to FIG. 8. The via parts VP of the fourth, fifth, and sixth thermal conductive redistribution patterns RP4(T), RP5(T), and RP6(TP) may have their bottom surfaces, each of which has a third width WT3 as shown in FIG. 10.

When viewed in a plan view, the line part LP of the sixth thermal conductive redistribution pattern RP6(TP) may have a shape the same as that of the first thermal conductive plate TP1 discussed with reference to FIG. 7A or 7C. The line part LP of the sixth thermal conductive redistribution pattern RP6(TP) may correspond to the first thermal conductive plate TP1 discussed with reference to FIG. 7A or 7C.

The via parts VP of the fourth, fifth, and sixth signal redistribution patterns RP4(S), RP5(S), and RP6(S) may have their bottom surfaces, each of which has a fourth width WT4 as shown in FIG. 10. The third width WT3 may be the same as or greater than the fourth width WT4.

The second signal terminals ST2 of the second semiconductor device CH2 may be connected through the second signal internal connection members IB2 to the sixth signal redistribution patterns RP6(S). The second ground terminals GT2 of the second semiconductor device CH2 may be connected through the second ground internal connection members GB2 to the sixth thermal conductive redistribution patterns RP6(TP). A ground voltage may be applied to the fourth, fifth, and sixth thermal conductive redistribution patterns RP4(T), RP5(T), and RP6(TP).

As regards semiconductor packages according to some example embodiments of the present inventive concepts, a first thermal conductive plate may be connected to a ground terminal of a first semiconductor device and a ground voltage may be applied to the first thermal conductive plate, and thus a ground voltage may be applied to all of a first thermal conductive via, a connection line, a shield layer, a second thermal conductive plate, and second external connection terminals. Further, the first thermal conductive via and the second external connection terminal each may be provided in plural, and the plurality of first thermal conductive vias and the plurality of second external connection terminals may be arranged along an edge of a first substrate. Therefore, it may be possible to electromagnetically shield substantially an entirety of the semiconductor package from external electromagnetic waves.

As regards semiconductor packages according to some example embodiments of the present inventive concepts, heat generated from semiconductor devices may be promptly outwardly discharged through a first thermal conductive plate, a first thermal conductive via, a second thermal conductive plate, and second external connection terminals. It may thus be possible to mitigate or prevent malfunction due to overheating of the semiconductor devices. As the first thermal conductive plate is disposed adjacent to a top surface of a first substrate, the first thermal conductive plate may be disposed close to the semiconductor devices, and thermal radiation may be easily or more effectively achieved. Moreover, because the first thermal conductive via is used as a thermal radiation path, and because the first thermal conductive via has a width and a vertical length greater than those of first signal vias, thermal radiation may be easily or more effectively accomplished. Thus, the semiconductor package may increase in reliability.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts. The embodiments of FIGS. 1A to 11 may be combined with each other.

What is claimed is:

1. A semiconductor package, comprising:
a substrate; and
at least one semiconductor chip on the substrate,
wherein the substrate includes,
a body layer having a top surface and a bottom surface,
a first thermal conductive plate on the top surface of the body layer, the first thermal conductive plate connected to a ground terminal of the semiconductor chip, and
a thermal conductive via penetrating the body layer and being in contact with the first thermal conductive plate.

2. The semiconductor package of claim 1, further comprising:
an adhesion layer between the semiconductor chip and the substrate,
wherein the adhesion layer is in contact with a top surface of the first thermal conductive plate.

3. The semiconductor package of claim 1, further comprising:
a plurality of upper conductive pads on the top surface of the body layer and spaced apart from the first thermal conductive plate; and
a plurality of signal vias penetrating the body layer and connected to the upper conductive pads,
wherein the thermal conductive via has a first width,
wherein each of the signal vias has a second width, and
wherein the first width is greater than the second width.

4. The semiconductor package of claim 1, wherein
the body layer includes a plurality of dielectric layers that are sequentially stacked, and
the thermal conductive via penetrates the dielectric layers.

5. The semiconductor package of claim 1, further comprising:
a second thermal conductive plate on the bottom surface of the body layer and connected to the thermal conductive via,
wherein the second thermal conductive plate is along an edge of the substrate.

6. The semiconductor package of claim 1, further comprising:
a shield layer covering the substrate and being in contact with a lateral surface of the substrate; and
an internal connection line in the body layer and exposed on the lateral surface of the substrate that is in contact with the shield layer,
wherein the thermal conductive via penetrates a layer occupied by the internal connection line.

7. The semiconductor package of claim 1, further comprising:
an under-fill layer between the semiconductor chip and the substrate, wherein the under-fill layer is in contact with a top surface of the first thermal conductive plate.

8. The semiconductor package of claim 1, wherein the first thermal conductive plate has one of 'C', 'L', or 'T' shape when viewed in a plan view.

9. The semiconductor package of claim 1, further comprising:
a shield layer covering the substrate and being adjacent to a top surface of the substrate; and
an electrically conductive adhesion layer between the shield layer and the first thermal conductive plate.

10. The semiconductor package of claim 1, wherein
the body layer includes a plurality of dielectric layers that are sequentially stacked,
the thermal conductive via includes a plurality of sub-vias that are sequentially stacked, and
the sub-vias penetrate corresponding ones of the dielectric layers, respectively.

11. A semiconductor package, comprising:
a substrate;
at least one semiconductor chip on the substrate;
a mold layer covering the semiconductor chip; and
a shield layer covering the mold layer,
wherein the substrate includes,
a body layer having a top surface and a bottom surface,
a first thermal conductive plate on the top surface of the body layer,
a plurality of signal vias penetrating at least a portion of the body layer, and
a thermal conductive via penetrating the body layer and being in contact with the first thermal conductive plate,
wherein the thermal conductive via has a first width,
wherein each of the signal vias has a second width,
wherein the first width is greater than the second width, and
wherein the first width is in a range of 100 μm to 500 μm.

12. The semiconductor package of claim 11, wherein
a plurality of thermal conductive vias including the thermal conductive via are provided, and
the plurality of thermal conductive vias are arranged along an edge of the substrate.

13. The semiconductor package of claim 11, wherein
the semiconductor chip includes a plurality of signal terminals and a ground terminal,
the thermal conductive via is connected to the ground terminal, and
the signal vias are connected to the signal terminals.

14. The semiconductor package of claim 11, wherein
the substrate further includes a plurality of upper conductive pads on the body layer, and
the first thermal conductive plate has an opening that exposes the upper conductive pads.

15. The semiconductor package of claim 11, wherein
the body layer includes a plurality of dielectric layers that are sequentially stacked, and
the thermal conductive via penetrates the dielectric layers.

16. A semiconductor package comprising:
a substrate; and
at least one semiconductor chip on the substrate,
wherein the substrate includes,
a body layer having a top surface and a bottom surface,
a first thermal conductive plate on the top surface of the body layer,
a plurality of signal vias penetrating at least a portion of the body layer, and
a thermal conductive via penetrating the body layer and being in contact with the first thermal conductive plate,
wherein the thermal conductive via has a first vertical length,
wherein each of the signal vias has a second vertical length,
wherein the first vertical length is greater than the second vertical length, and
wherein the first vertical length is in a range of 120 μm to 500 μm.

17. The semiconductor package of claim 16, wherein
the thermal conductive via has a first width,
each of the signal vias has a second width, and
the first width is greater than the second width.

18. The semiconductor package of claim 16, wherein
the semiconductor chip includes a plurality of signal terminals and a ground terminal,
the thermal conductive via is connected to the ground terminal, and
the signal vias are connected to the signal terminals.

19. The semiconductor package of claim 16, wherein
the body layer includes a plurality of dielectric layers that are sequentially stacked, and
the thermal conductive via penetrates the dielectric layers.

20. The semiconductor package of claim 16, further comprising:
a second thermal conductive plate on the bottom surface of the body layer and connected to the thermal conductive via,
wherein the second thermal conductive plate is along an edge of the substrate.

* * * * *